(12) United States Patent
Koller et al.

(10) Patent No.: US 7,233,053 B2
(45) Date of Patent: Jun. 19, 2007

(54) INTEGRATED SEMICONDUCTOR PRODUCT WITH METAL-INSULATOR-METAL CAPACITOR

(75) Inventors: Klaus Koller, Germering (DE); Heinrich Körner, Bruckmühl (DE); Michael Schrenk, Diessen am Ammersee (DE)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 10/865,463

(22) Filed: Jun. 10, 2004

(65) Prior Publication Data

US 2005/0012223 A1    Jan. 20, 2005

Related U.S. Application Data

(63) Continuation of application No. PCT/EP02/13804, filed on Dec. 5, 2002.

(30) Foreign Application Priority Data

Dec. 13, 2001    (DE) ................... 101 61 286

(51) Int. Cl.
*H01L 29/00*    (2006.01)
*H01L 21/00*    (2006.01)

(52) U.S. Cl. ............... 257/532; 257/535; 438/396

(58) Field of Classification Search ........... 257/532, 257/535; 438/396
See application file for complete search history.

(56) References Cited

U.S. PATENT DOCUMENTS

| | | | | |
|---|---|---|---|---|
| 4,971,924 A | * | 11/1990 | Tigelaar et al. | 438/396 |
| 5,674,771 A | * | 10/1997 | Machida et al. | 438/396 |
| 5,918,135 A | | 6/1999 | Lee et al. | 438/393 |
| 6,086,951 A | | 7/2000 | Lin et al. | 427/253 |
| 6,090,656 A | * | 7/2000 | Randazzo | 438/239 |
| 6,166,423 A | | 12/2000 | Gambino et al. | 257/532 |
| 6,184,551 B1 | | 2/2001 | Lee et al. | 257/310 |
| 6,291,337 B1 | * | 9/2001 | Sidhwa | 438/627 |

(Continued)

FOREIGN PATENT DOCUMENTS

DE    199 45 939 A1    4/2001

(Continued)

OTHER PUBLICATIONS

Kar-Roy, A., et al.; "High Density Metal Insulator Metal Capacitors Using PECVD Nitride for Mixed Signal and RF Circuits"; Advanced Process Technology; pp. 245-247.

*Primary Examiner*—Evan Pert
(74) *Attorney, Agent, or Firm*—Baker Botts L.L.P.

(57) ABSTRACT

To fabricate an integrated semiconductor product with integrated metal-insulator-metal capacitor, first of all a dielectric auxiliary layer (6) is deposited on a first electrode (2, 3, 5). This auxiliary layer (6) is then opened up (15) via the first electrode. Then, a dielectric layer (7) is produced, and the metal track stack (8, 9, 10) for the second electrode is then applied to the dielectric layer (6). This is followed by the patterning of the metal-insulator-metal capacitor using known etching processes. This makes it possible to produce dielectric capacitor layers of any desired thickness using materials which can be selected as desired. In particular, this has the advantage that via etches can be carried out significantly more easily than in the prior art, since it is not necessary to etch through the residual dielectric capacitor layer above the metal tracks.

20 Claims, 3 Drawing Sheets

U.S. PATENT DOCUMENTS

| | | | |
|---|---|---|---|
| 6,313,003 B1 * | 11/2001 | Chen | 438/396 |
| 6,320,244 B1 * | 11/2001 | Alers et al. | 257/534 |
| 6,329,234 B1 | 12/2001 | Ma et al. | 438/210 |
| 6,730,573 B1 * | 5/2004 | Ng et al. | 438/381 |
| 6,815,796 B2 * | 11/2004 | Ota et al. | 257/528 |

FOREIGN PATENT DOCUMENTS

| | | |
|---|---|---|
| EP | 0 800 217 A1 | 3/1997 |
| GB | 2 353 404 A | 2/2001 |
| JP | 11233723 | 8/1999 |
| JP | 228497 | 8/2000 |

\* cited by examiner

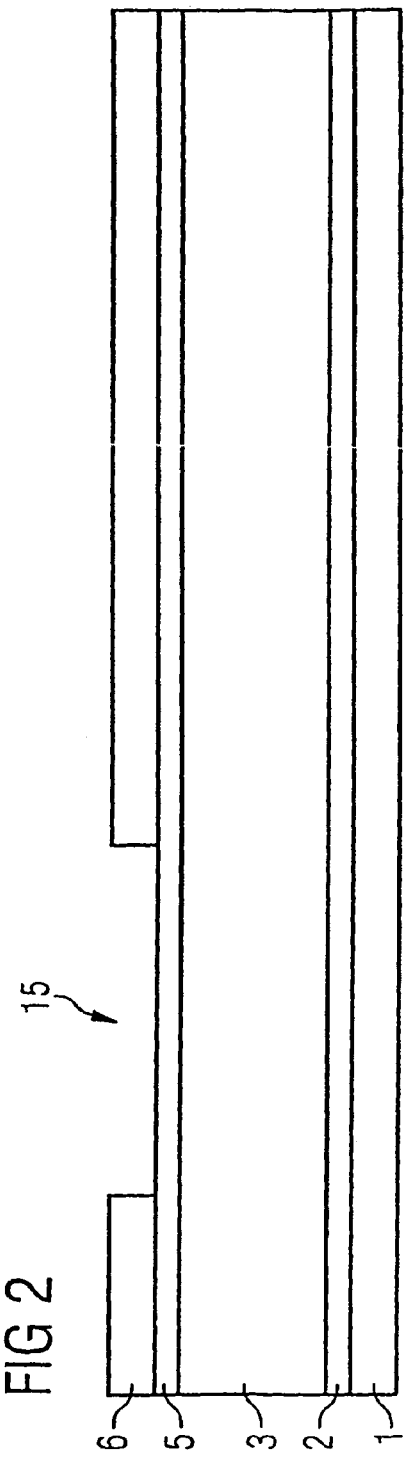
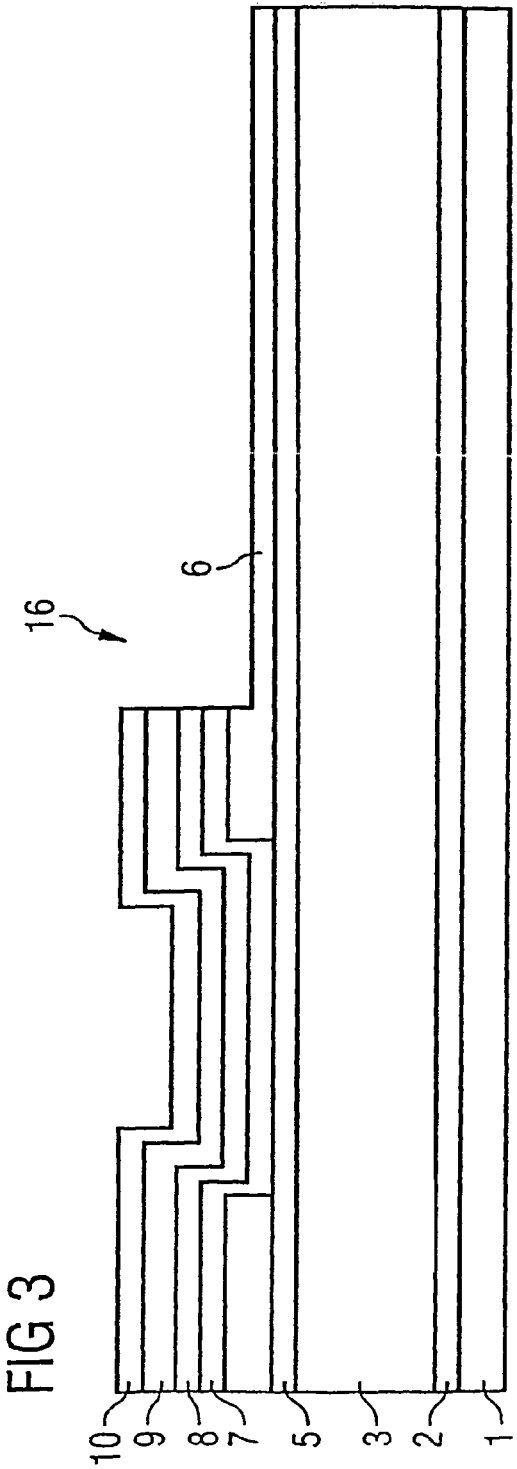

INTEGRATED SEMICONDUCTOR PRODUCT WITH METAL-INSULATOR-METAL CAPACITOR

CROSS REFERENCE TO RELATED APPLICATION

This application is a continuation of copending International Application No. PCT/EP02/13804 filed Dec. 5, 2002 which designates the United States, and claims priority to German application no. 101 61 286.9 filed Dec. 13, 2001.

TECHNICAL FIELD OF THE INVENTION

The invention relates generally to an integrated semiconductor product with interconnects and a metal-insulator-metal capacitor. The present invention relates in particular to an integrated semiconductor product with interconnects which include aluminum as an essential constituent.

BACKGROUND OF THE INVENTION

High-frequency circuits in BIPOLAR, BICMOS and CMOS technology require integrated capacitors with a high voltage linearity, accurately settable capacitances and in particular low parasitic capacitances. The conventional MOS or MIS capacitors which have been used hitherto have an unsatisfactory voltage linearity on account of voltage-induced space charge regions. The short distance from the substrate also entails numerous parasitic capacitances.

These difficulties can be avoided by using what are known as metal-insulator-metal capacitors (MIM capacitors), which are usually arranged between two metallization levels and are therefore at a considerably greater distance from the substrate. As far as possible, these metal-insulator-metal capacitors should be integrated in the existing concepts for multilayer metallization without changing and influencing the adjacent interconnects.

Previous approaches, such as for example those which are known from the printed specifications U.S. Pat. No. 5,946, 567, EP 0 800 217 A1 and EP 1 130 654 A1 and the article "High Density Metal Insulator Metal Capacitors Using PECVD Nitride for Mixed Signal and RF Circuits", IITC, pp. 245–247, IEEE (1999) by Kar-Roy et al. use the materials silicon dioxide and/or silicon nitride, which are well characterized and known in the micro-electronics industry, as dielectrics. However, the dielectric constants k of these materials are not especially high, at approximately four to seven. Furthermore, on account of the use in the multilayer metallization, they have to be deposited using plasma (PECVD) processes. These processes are typically distinguished by high deposition rates, but also by high defect densities and lower layer qualities. Therefore, in plasma processes it is virtually impossible to produce layers of less than 60 nm with a reproducible thickness and sufficient quality.

Moreover, in the integration concepts cited above, the top electrode is patterned with the aid of a top electrode etch, which has to be stopped in the dielectric of the capacitor. For this reason, these processes absolutely must have a dielectric layer with a sufficient thickness of at least 60 nm.

The starting point for the fabrication of an MIM capacitor according to the prior art is the stack shown in FIG. 4. In this case, an adhesive layer 2 of Ti, an interconnect 3 of Al and an antireflection coating (ARC) layer 5 of Ti/TiN are deposited onto a substrate 1. This stack has at the same time the function of a first electrode. A dielectric layer 6 is applied to this stack. Deposited above the dielectric layer 6 is the metal stack for the second electrode. It comprises two TiN (Ti) layers 8, 10 and an Al layer 9 lying in between. FIG. 5 shows a process stage in which the second electrode 8, 9, 10 and the dielectric 6 have already been patterned. As can be seen from the etching edge 16, the dielectric 6 in the region outside the second electrode 8, 9, 10 serves here as an etching stop.

The surface area-specific capacitance of known capacitors of this type is around 1 fF/μm$^2$; however, for future high-frequency applications, a multiple of this capacitance will be required. The surface area-specific capacitance of a capacitor is substantially determined by the thickness of the dielectric separating layer and the dielectric constant. Therefore, the surface area-specific capacitance of a capacitor can be increased by using dielectrics with a high dielectric constant (>8). Furthermore, insulation layers which are thinner than 60 nm lead to an increase in the surface area-specific capacitance.

Working on the basis of the prior art described, the invention is based on the object of providing an improved integrated semiconductor product having interconnects and a metal-insulator-metal capacitor and of describing a method for its fabrication.

SUMMARY OF THE INVENTION

This object can be achieved by an integrated semiconductor product with interconnects, which include aluminum as an essential constituent, and which has at least one metal-insulator-metal capacitor which comprises a first electrode, a dielectric layer and a second electrode. The dielectric layer is arranged in an opening, arranged above the first electrode, in a dielectric auxiliary layer.

The dielectric layer may contain at least one of the following substances: $Al_2O_3$, $HfO_2$, $La_2O_3$, $Ta_2O_5$, $TiO_2$, $ZrO_2$ and all mixed oxides, oxynitrides and silicates thereof, $SrTiO_3$, $Ba_xSr_{1-x}TiO_3$ where $0 \leq x \leq 1$ (BST), $PbZr_xTi_{1-x}O_3$ where $0 \leq x \leq 1$ (PZT), $SiO_2$, $Si_3N_4$. The first and/or the second electrode can be a stack comprising metal layers and conductive barriers. The first electrode and/or the second electrode, in addition to the aluminum, may contain at least one of the following metals: Si, W, Cu, Au, Ag, Ti, Pt. The barriers may contain at least one of the following substances: Ta, TaN, TiW, W, $WN_x$ where $0<x<2$, Ti, TiN, silicides, carbides. The dielectric layer can be formed by a dielectric material with a dielectric constant of >8. The dielectric layer can be applied using one of the following processes from the group consisting of: CVD, PECVD, MOCVD, PVD, ALD. The dielectric layer can be produced by an oxidation of the surface of the first electrode or by an oxidation of a layer on the first electrode. The thickness of the dielectric layer may be less than 60 nm. The surface area-specific capacitance of the capacitor may be at least 3 fF/μm$^2$.

The object can also be achieved by a method for fabricating an integrated semiconductor product with interconnects, which include aluminum as an essential constituent, and at least one metal-insulator-metal capacitor, which comprises a first electrode, a dielectric layer and a second electrode. The method comprises the following steps:

(a) the first electrode is produced in a layer which is also intended as a layer for interconnects;

(b) a dielectric auxiliary layer is applied;

(c) the dielectric auxiliary layer is opened above the first electrode;

(d) the dielectric layer for the capacitor is produced;
(e) the second electrode is produced.

A liner layer, a metal layer and an ARC layer can be applied for the first electrode. Two conductive barriers and a metal layer may be arranged between them are applied for the second electrode. The dielectric layer can be produced using one of the following processes: CVD, PECVD, MOCVD, PVD, ALD. The surface of the first electrode or a layer on the first electrode can be oxidized in order to produce the dielectric layer. The opening above the first electrode can be exposed to an atmosphere containing oxygen. The dielectric auxiliary layer may become part of an upper intermetal dielectric which is deposited after the production of the second electrode. A further metallization layer for upper interconnects can be deposited above the upper intermetal dielectric. At least one upper interconnect 13 can be connected to the capacitor through at least one via. A conductive barrier can be applied to the first electrode before step (d). A conductive barrier can be applied selectively to the first electrode before step (d).

The concept proposed here is suitable in particular, although not exclusively, for the integration of MIM capacitors with thin dielectrics without significantly altering the reliability of the other metal tracks. The reliability of the other metal tracks remains substantially unchanged, since in particular there are no residues of the dielectric capacitor layer on the other metal tracks. Moreover, the method according to the present invention is relatively uncritical to implement in terms of the individual process steps and allows greater degrees of freedom in the selection of materials and their thickness. In particular, the method according to the present invention has the advantage that via etches can be carried out significantly more easily than in the prior art, since it is not necessary to etch through the residual dielectric capacitor layer above the metal tracks.

The metal-insulator-metal capacitor has a first electrode, which is formed in a metal level for interconnects. Since the dielectric interlayer and the metallization layer for the second electrode can be kept thin, the metal-insulator-metal capacitor can be integrated without great difficulty in an existing concept for the fabrication of an integrated semiconductor product with passive semiconductor products.

The metal-insulator-metal capacitor is expediently fabricated by applying a metal layer for interconnects to a substrate. This layer may also comprise, in particular, a liner layer and an ARC layer. Then, a dielectric auxiliary layer is deposited on the metal layer for interconnects. It serves as a partial sacrificial layer and does not act as the MIM dielectric, but rather becomes part of the intermetal dielectric (IMED) which is subsequently applied. The known methods of lithography and etching are used to remove the dielectric layer at the locations at which it is intended to integrate an MIM capacitor. In this case, it is particularly preferable if a corresponding etch stops selectively at the lower electrode. A dielectric layer made from material which can be selected as desired and with any desired thickness is deposited on the correspondingly patterned surface. Then, the materials which form the second electrode are applied and patterned appropriately.

This opens up the possibility of depositing an extremely thin dielectric layer by ALD (atomic layer deposition). Particularly ideal conditions for growth are obtained for dielectrics to be deposited by means of ALD if, after opening up the auxiliary layer, the substrate is slightly oxidized superficially in an ambience containing oxygen.

According to a further preferred embodiment of the method according to the invention, a conductive barrier is applied to the first electrode before step (d). In this context, it is particularly preferable if the conductive barrier is applied selectively only to the uncovered first electrode.

BRIEF DESCRIPTION OF THE DRAWINGS

An exemplary embodiment of the invention is explained below with reference to the appended drawings, in which:

FIG. 2 shows an excerpt of a cross section through a metal track stack, as used for the first electrode of an MIM capacitor according to an exemplary embodiment of the present invention, and a dielectric auxiliary layer deposited on the stack, in which the dielectric auxiliary layer has already been opened up above the first electrode.

FIG. 3 shows an excerpt from a cross section through an integrated semiconductor product with an integrated metal-insulator-metal capacitor according to an exemplary embodiment of the present invention.

DESCRIPTION OF THE INVENTION

Figure 1:
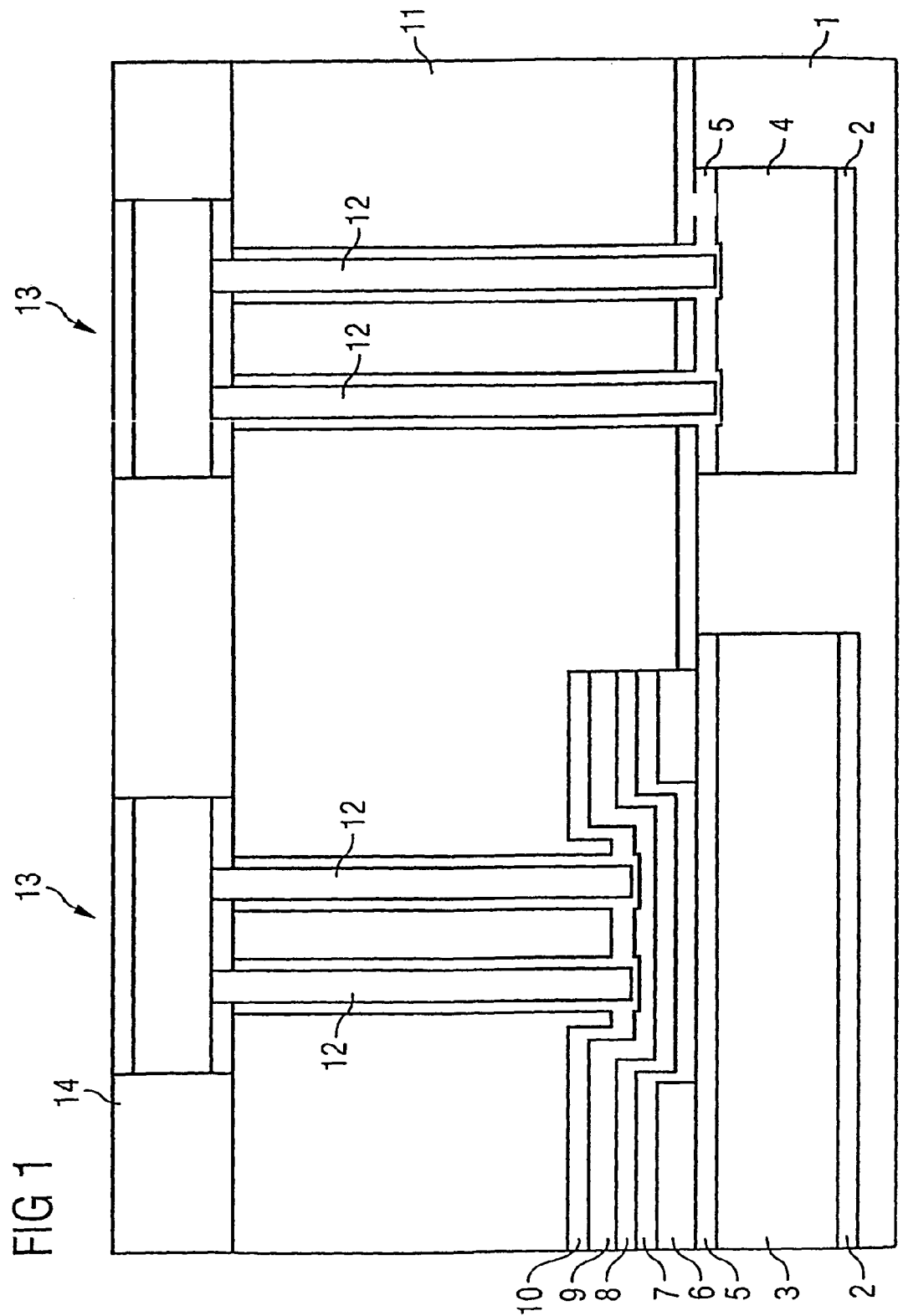
FIG. 1 shows an excerpt from a cross section through an integrated semiconductor product which includes a metal-insulator-metal capacitor, according to an exemplary embodiment of the invention.
Figure 4:
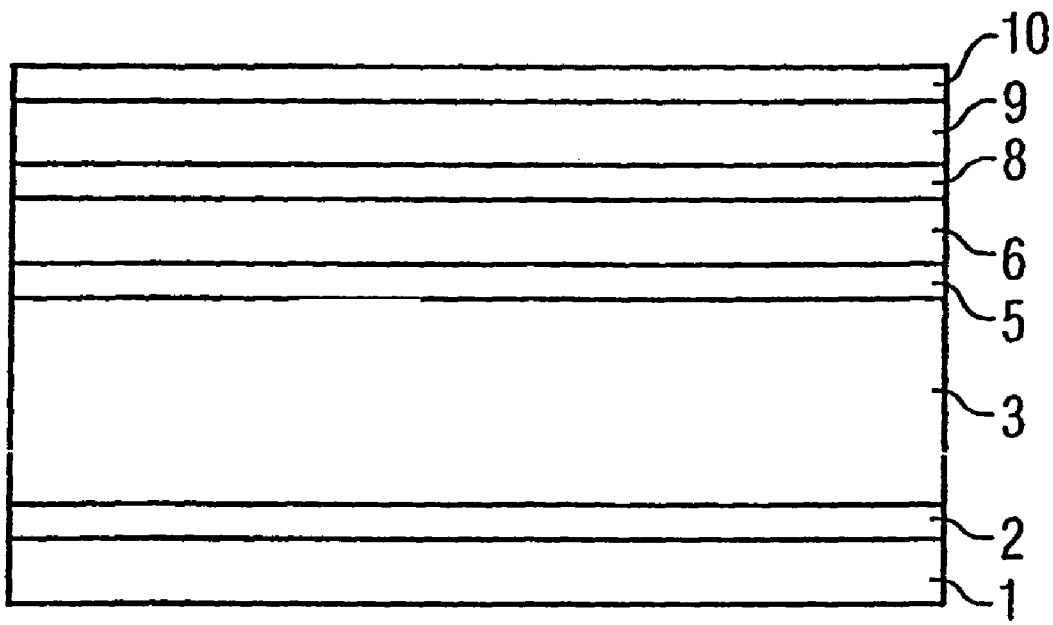
FIG. 4 shows an excerpt from a cross section through a layer stack, as used for the fabrication of an MIM capacitor according to the prior art.
Figure 5:
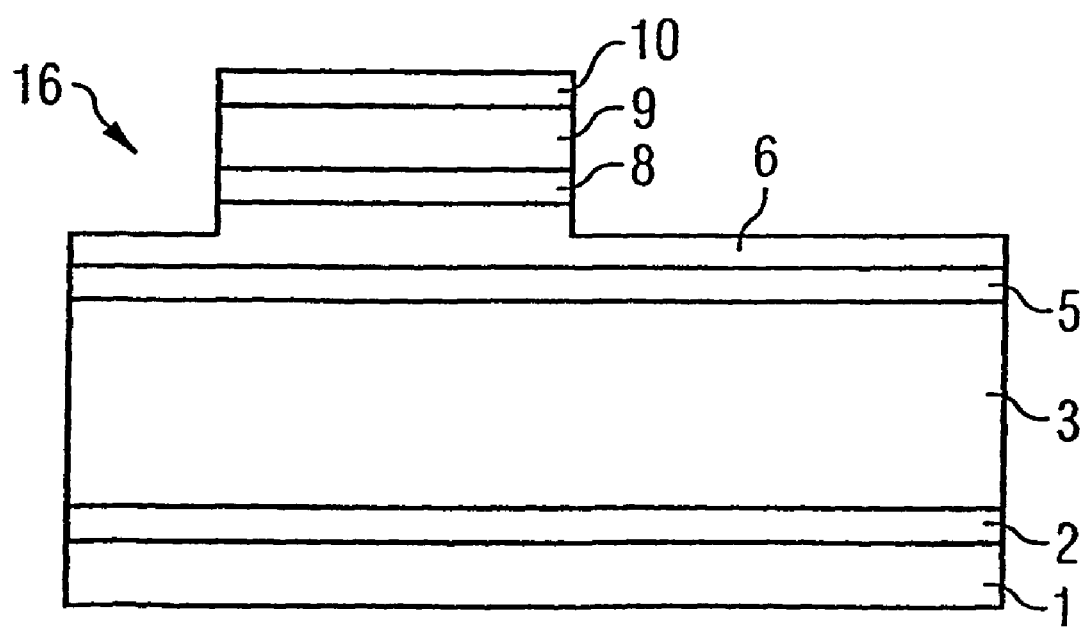
FIG. 5 shows the excerpt from FIG. 4 after patterning of the second electrode has taken place.

FIG. 2 shows a metal track stack with an adhesive layer 2 of Ti, an interconnect 3 of AlCu and an antireflective coating (ARC) layer 5, as used in the corresponding prior art. In this case, the interconnect 3 is also intended to act as a lower MIM electrode. A dielectric auxiliary layer 6 of, for example, $SiO_2$ or $Si_3N_4$, with a thickness of approx. 50–100 nm, is deposited on the metal track stack 2, 3, 4 using known processes which are compatible with metallization. It serves as a partial sacrificial layer and does not act as an MIM dielectric, but rather becomes part of the intermetal dielectric (IMD) applied subsequently. Using the known methods of lithography and etching, the dielectric auxiliary layer is removed at the location 15 at which it is intended to integrate an MIM capacitor.

FIG. 3 shows the MIM capacitor after the deposition and patterning of the MIM dielectric 7 and of the upper electrode 8, 9, 10 have taken place. A dielectric layer 7, for example of $Al_2O_3$, with a thickness of 20 nm is now produced on the opened dielectric auxiliary layer 6. However, this is not imperative, since the dielectric 7 can be selected as desired and can be deposited in any desired thickness. Furthermore, a conductive barrier, (not shown), can be applied to the first electrode prior to the deposition of the dielectric. It is particularly preferable if the conductive barrier is applied selectively only to the uncovered first electrode.

Since, according to this exemplary embodiment, an integration route does not impose any minimum demands on the thickness, etching properties and other properties of the dielectric layer 7, any desired processes can be used to produce it, such as CVD, PECVD, MOCVD and PVD, provided that the layers can be produced at temperatures below 400° C. The dielectric layer 7 can also be produced with the aid of oxidation of the surface of the lower electrode or with the aid of oxidation of a layer provided for this purpose (e.g. TaN) on the lower electrode. Furthermore, it is possible for the dielectric layer 7 to be deposited by ALD (atomic layer deposition). This process makes it possible to produce extremely thin layers by means of atomic layer deposition. The process according to the invention makes it possible to achieve capacitors with specific capacitances of 3 fF/pm² to well above 10 fF/pm², which with the previous approaches it was impossible to produce reproducibly in sufficient quality.

Ideal conditions for growth for dielectrics to be deposited by means of ALD are obtained if, after opening up the sacrificial layer 6, the substrate is slightly oxidized superficially in an ambience containing oxygen. The native oxide produced as a result in the ARC layer 5 offers similar good preconditions for the depositing of any desired oxides as the adjacent dielectric auxiliary layer 6, so that the desired oxide layers spontaneously grow on it, in a reproducible and dense manner and with highest quality.

Then, the materials for the upper electrode are applied. These in turn comprise conductive barriers 8, 10 which may, for example, contain TiN. Between them, there is a metallic layer 9, which may, for example, contain AlCu. The topology produced by the previous opening 15 in the first dielectric layer 6 is relatively small: the edge length of the lower electrodes is greater than 1 μm, and the step height is approx. 50–100 nm. Therefore, the topology can be well covered by the selected deposition processes.

This is followed by the etching of the stack comprising the upper electrode 8, 9, 10, the dielectric layer 7 and the auxiliary layer 6. In this context, no particular demands are imposed on the residual thickness of the dielectric auxiliary layer 6 which remains on the lower metal track 2, 3, 5 and therefore on the selectivity of the etching process. As a result, unlike with the concepts which have been described and similar concepts, there is a very wide process window for the entire procedure combined, at the same time, with a free choice of the dielectric 7 and its thickness.

Next, an upper intermetal dielectric 11 is deposited. Any residues of the dielectric auxiliary layer 6 then simply become part of this IMED 11. Vias 12 are formed in order to make contact with the capacitor and the lower interconnect 4 and these vias are connected at their upper end to upper interconnects 13. These upper interconnects 13 are in turn embedded in an intermetal dielectric 14. The via etches can be carried out significantly more easily than in the prior art, since there is no need to etch through the residual dielectric capacitor layer above the metal tracks.

The metallization and plate capacitor materials described in the above exemplary embodiment are given by way of example without implying any limitation. In particular, all conductive materials, such as Si, W, Cu, Ag, Au, Ti, Pt and alloys thereof, can be used as interconnects. In addition to Ti and TiN, TiW, W, $WN_x$ where $0 \leq x \leq 2$, Ta, TaN, silicides and carbides are also particularly suitable as alternative barriers or liner layers. All the abovementioned materials and combinations thereof can be used as electrodes. In addition to the conventional dielectrics used in semiconductor technology, namely $SiO_2$ and $Si_3N_4$, the full range of materials with a significantly higher k is available, in particular $Al_2O_3$, $ZrO_2$, $HfO_2$, $Ta_2O_5$, $L_2O_3$, $TiO_2$ and the mixed oxides, oxynitrides and silicates thereof, $SrTiO_3$, $Ba_xSr_{1-x}TiO_3$ where $0 \leq x \leq 1$ (BST) and $PbZr_xTi_{1-x}O_3$ where $0 \leq x \leq 1$ (PZT).

The invention claimed is:

1. An integrated semiconductor product comprising interconnects, which include aluminum as an essential constituent, and at least one metal-insulator-metal capacitor, which comprises a first electrode, a dielectric layer and a second electrode, wherein the dielectric layer is arranged in an opening, arranged above the first electrode, in a dielectric auxiliary layer wherein the dielectric auxiliary layer serves as a partial sacrificial layer after forming said dielectric layer.

2. The semiconductor product as claimed in claim 1, wherein the dielectric layer contains at least one of the following substances from the group consisting of: $Al_2O_3$, $HfO_2$, $La_2O_3$, $Ta_2O_5$, $TiO_2$, $ZrO_2$ and all mixed oxides, oxynitrides and silicates thereof, $SrTiO_3$, $Ba_xSr_{1-x}TiO_3$ where $0 \leq x \leq 1$ (BST), $PbZr_xTi_{1-x}O_3$ where $0 \leq x \leq 1$ (PZT), $SiO_2$, $Si_3N_4$.

3. The semiconductor product as claimed in claim 1, wherein the first and/or the second electrode is a stack comprising metal layers and conductive barriers.

4. The semiconductor product as claimed in claim 1, wherein the first electrode and/or the second electrode, in addition to the aluminum, contains at least one of the following metals from the group consisting of: Si, W, Cu, Au, Ag, Ti, Pt.

5. The semiconductor product as claimed in claim 3, wherein the barriers contain at least one of the following substances from the group consisting of: Ta, TaN, TiW, W, $WN_x$ where $0<x<2$, Ti, TiN, silicides, carbides.

6. The semiconductor product as claimed in claim 1, wherein the dielectric layer is formed by a dielectric material with a dielectric constant of > 8.

7. The semiconductor product as claimed in claim 1, wherein the dielectric layer is applied using one of the following processes from the group consisting of: CVD, PECVD, MOCVD, PVD, ALD.

8. The semiconductor product as claimed in claim 1, wherein the dielectric layer is produced by an oxidation of the surface of the first electrode or by an oxidation of a layer on the first electrode.

9. The semiconductor product as claimed in claim 1, wherein the thickness of the dielectric layer is less than 60 nm.

10. An integrated semiconductor product comprising interconnects, which include aluminum as an essential constituent, and at least one metal-insulator-metal capacitor, which comprises a first electrode, a dielectric layer and a second electrode, wherein the dielectric layer is arranged in an opening, arranged above the first electrode, in a dielectric auxiliary layer, wherein the dielectric layer is in direct contact with the dielectric auxiliary layer, the surface area-specific capacitance of the capacitor is at least 3 fF/μm², wherein the dielectric auxiliary layer serves as a partial sacrificial layer after forming said dielectric layer.

11. The semiconductor product as claimed in claim 10, wherein the dielectric layer contains at least one of the following substances from the group consisting of: $Al_2O_3$, $HfO_2$, $La_2O_3$, $Ta_2O_5$, $TiO_2$, $ZrO_2$ and all mixed oxides, oxynitrides and silicates thereof, $SrTiO_3$, $Ba_xSr_{1-x}TiO_3$ where $0 \leq x \leq 1$ (BST), $PbZr_xTi_{1-x}O_3$ where $0 \leq x \leq 1$ (PZT), $SiO_2$, $Si_3N_4$.

12. The semiconductor product as claimed in claim 10, wherein the first and/or the second electrode is a stack comprising metal layers and conductive barriers.

13. The semiconductor product as claimed in claim 12 wherein the barriers contain at least one of the following substances from the group consisting of: Ta, TaN, TiW, W, $WN_x$ where $0<x<2$, Ti, TiN, silicides, carbides.

14. The semiconductor product as claimed in claim 10, wherein the first electrode and/or the second electrode, in addition to the aluminum, contains at least one of the following metals from the group consisting of: Si, W, Cu, Au, Ag, Ti, Pt.

15. The semiconductor product as claimed in claim 10, wherein the dielectric layer is formed by a dielectric material with a dielectric constant of > 8.

16. The semiconductor product as claimed in claim 10, wherein the dielectric layer is applied using one of the following processes from the group consisting of: CVD, PECVD, MOCVD, PVD, ALD.

17. The semiconductor product as claimed in claim 10, wherein the dielectric layer is produced by an oxidation of the surface of the first electrode or by an oxidation of a layer on the first electrode.

18. The semiconductor product as claimed in claim 10, wherein the thickness of the dielectric layer is less than 60 nm.

19. An integrated semiconductor product comprising interconnects, which include aluminum as an essential constituent, and at least one metal-insulator-metal capacitor, which comprises a first electrode being formed by one of the interconnects, a dielectric layer and a second electrode, wherein the dielectric layer is arranged in an opening, arranged above the first electrode, in a dielectric auxiliary layer, wherein the thickness of the dielectric layer is less than 60 nm, and wherein the dielectric auxiliary layer serves as a partial sacrificial layer after forming said dielectric layer.

20. An integrated semiconductor product comprising interconnects, which include aluminum as an essential constituent, and at least one metal-insulator-metal capacitor, which comprises a first electrode, a dielectric layer and a second electrode, wherein the dielectric layer is arranged in an opening, arranged above the first electrode, in a dielectric auxiliary layer and wherein the first electrode is formed by at least a part of one of the interconnects, and wherein the dielectric auxiliary layer serves as a partial sacrificial layer after forming said dielectric layer.

* * * * *